United States Patent [19]

Senoh et al.

[11] Patent Number: 5,680,071
[45] Date of Patent: Oct. 21, 1997

[54] TRISTATE VOLTAGE BOOSTED INTEGRATED CIRCUIT

[75] Inventors: Manabu Senoh; Yoshitaka Mano; Akinori Shibayama, all of Osaka, Japan

[73] Assignee: Matsushita Electronics Corporation, Osaka, Japan

[21] Appl. No.: 592,676

[22] Filed: Jan. 26, 1996

[30] Foreign Application Priority Data

Jan. 27, 1995 [JP] Japan .................. 7-011386

[51] Int. Cl.⁶ ................................. H03K 17/16
[52] U.S. Cl. ................. 327/390; 327/111; 327/112; 327/589
[58] Field of Search ............... 327/109, 111–112, 327/390, 536, 589

[56] References Cited

U.S. PATENT DOCUMENTS

| | | |
|---|---|---|
| 5,319,604 | 6/1994 | Imondi et al. .............. 327/390 |
| 5,444,362 | 8/1995 | Chung et al. ............... 327/536 |
| 5,561,385 | 10/1996 | Choi ........................ 327/536 |
| 5,587,678 | 12/1996 | Dijkmans ................... 327/111 |

FOREIGN PATENT DOCUMENTS 000466238  1/1992  European Pat. Off. ........ 327/111

*Primary Examiner*—Margaret Rose Wambach
*Attorney, Agent, or Firm*—McDermott, Will & Emery

[57] ABSTRACT

In a dynamic random access memory (DRAM), first and second output transistors form an NMOS-type tristate output buffer. Interposed between a gate electrode of the first output transistor and a data input/output terminal (DQ terminal) is an auxiliary transistor of which gate electrode is grounded and of which threshold voltage is lower than that of the first output transistor. Further interposed between the DQ terminal and a gate electrode of the second output transistor is another auxiliary transistor of which gate electrode is grounded and of which threshold voltage is lower than that of the second output transistor. Both auxiliary transistors lower gate voltages of both output transistors down to a negative voltage level such that both output transistors are maintained as cut off when a negative voltage is externally applied to the DQ terminal at the time of high impedance.

11 Claims, 10 Drawing Sheets

TRISTATE VOLTAGE BOOSTED INTEGRATED CIRCUIT

BACKGROUND OF THE INVENTION

The present invention relates to a semiconductor integrated circuit incorporating a tristate output circuit.

As an example of the semiconductor integrated circuit, there is known a dynamic random access memory (DRAM) having a data input buffer and a data output buffer. The data input buffer is arranged to supply, to a write amplifier an input data signal having a logic level corresponding to the logic level (high voltage level "H" or low voltage level "L") of data signal supplied from a data input/output terminal or DQ terminal which is one of external terminals. The data output buffer is arranged to supply, to the DQ terminal, a data signal having a logic level corresponding to the logic of an output data signal supplied from a read amplifier.

In a semiconductor integrated circuit, when MOS transistors are formed on a P-type silicon substrate, a negative bias voltage is generally supplied to the substrate. The application of the bias voltage to the substrate assures the stabilization of the substrate potential, the stabilization of the threshold voltages of the MOS transistors, the prevention of capacitive coupling between the signal lines and the substrate, a reduction in junction capacitances of the MOS transistors and the like. There is known a having an on-chip substrate bias circuit.

In a DRAM, there is suitably used an NMOS-type data output buffer and a CMOS-type data output buffer.

A conventional NMOS-type data output buffer employs a tristate output circuit having (i) an N-channel MOS transistor (a first output transistor) interposed between a power supply VDD (e.g., 5 V) and a DQ terminal, and (ii) an N-channel MOS transistor (a second output transistor) interposed between the DQ terminal and a grounding VSS (0 V). The gate voltages of the first and second output transistors are controlled such that the first output transistor is turned on at the time of an "H" data output operation in the read operation of the DRAM, that the second output transistor is turned on at the time of an "L" data output operation in the read operation, and that both output transistors are cut off at the time of the non-read operation such as a write operation or the like of the DRAM. Since both output transistors are cut off at the time of the non-read operation, the data output buffer is brought to a high impedance state with respect to the DQ terminal.

In this NMOS-type data output buffer, an "L" level voltage or 0 V is supplied to the gate electrodes of the first output transistor (N-channel MOS transistor) and the second output transistor (N-channel MOS transistor) such that both output transistors are cut off at the time of the non-read operation of the DRAM. At such a state, when a negative voltage (−VDQ) is externally applied to the DQ terminal and the absolute value VDQ of the negative voltage thus applied exceeds the threshold voltage Vtn (Vtn>0) of both output transistors, both output transistors are turned on contrary to the expectations. Thus, an electric current IDQ flows out from the power supply VDD and the grounding VSS to the DQ terminal. This outflow current IDQ is increased as the absolute value VDQ of the applied voltage becomes greater. This makes it difficult to maintain the substrate voltage negative due to the substrate current resulting from the current IDQ, thus provoking an erroneous operation.

More specifically, when the gate, source and drain voltages of the first output transistor are now respectively referred to as Vg1, Vs1, Vd1, the Vg1 is equal to 0 V, the Vs1 is equal to −VDQ (−VDQ<−Vtn), and the Vd1 is equal to 5 V. Accordingly, when the gate-source voltage of the first output transistor is now referred to as Vgs1, the Vgs1 (Vgs1=Vg1−Vs1) is greater than the threshold voltage Vtn. Therefore, the first output transistor is turned on and the drain current Ids1 flows out from the power supply VDD to the DQ terminal. Further, when the drain-source voltage of the first output transistor is now referred to as Vds1, the Vds1 is greater than the Vgs1, causing a great drain current Ids1 to flow.

On the other hand, when the gate, source and drain voltages of the second output transistor are now respectively referred to as Vg2, Vs2, Vd2, the Vg2 is equal to 0 V, the Vs2 is equal to −VDQ (−VDQ <−Vtn) and the Vd2 is equal to 0 V. Accordingly, when the gate-source voltage of the second output transistor is now referred to as Vgs2, the Vgs2 (Vgs2=Vg2−Vs2) is greater than the threshold voltage Vtn. Therefore, the second output transistor is turned on and the drain current Ids2 flows out from the grounding VSS to the DQ terminal. However, when the drain-source voltage of the second output transistor is now referred to as Vds2, the Vds2 is equal to the Vgs2 such that the drain current Ids2 of the second output transistor is smaller than the drain current Ids1 of the first output transistor.

As thus discussed, the proportion of the Ids1 in the current IDQ (IDQ=Ids1+Ids2) flowing to the DQ terminal is greater than the proportion of the Ids2. That is, the influence of the first output transistor exerted upon the substrate current is predominant. It is therefore important to lower the substrate current resulting from the first output transistor in order to restrain the substrate voltage from being increased.

A conventional CMOS-type data output buffer employs a tristate output circuit having (i) a P-channel MOS transistor (first output transistor) interposed between a power supply VDD (e.g., 5 V) and a DQ terminal, and (ii) an N-channel MOS transistor (second output transistor) interposed between the DQ terminal and a grounding VSS (0 V). In the CMOS type too, the gate voltages of the first and second output transistors are controlled such that the first output transistor is turned on at the time of the "H" data output operation, that the second output transistor is turned on at the time of the "L" data output operation, and that both output transistors are cut off at the time of the non-read operation. Since both output transistors are cut off at the time of the non-read operation, the data output buffer is brought to a high impedance state with respect to the DQ terminal.

In this CMOS-type data output buffer, an "H" level voltage or power supply voltage VDD (5 V) is supplied to the gate electrode of the first output transistor and an "L" level voltage or 0 V is supplied to the gate electrode of the second output transistor such that both the first output transistor (P-channel MOS transistor) and the second output transistor (N-channel MOS transistor) are cut off at the time of the non-read operation of the DRAM. At such a state, when a positive voltage VDQ' exceeding the power supply voltage VDD is externally applied to the DQ terminal, a variety of troubles are caused.

More specifically, when the gate, source and drain voltages of the first output transistor (P channel MOS transistor) are now respectively referred to as Vg, Vs, Vd, the Vg is equal to 5 V, the Vs is equal to 5 V and the Vd is equal to VDQ' (VDQ'>5 V). The first output transistor has an N-type well region in a P-type silicon substrate, and the source and drain of the first output transistor are formed in a P-type diffusion region. Accordingly, due to the high drain voltage Vd, a forward large current flows at a PN junction of the P-type diffusion region and the N-type well region, thus disadvantageously introducing problems such as latch-up, breakage of memory cell data and the like.

SUMMARY OF THE INVENTION

It is an object of the present invention to mitigate, in a semiconductor integrated circuit incorporating a tristate output circuit connected to an external terminal, the influence of an externally applied voltage at the time of high impedance.

It is another object of the present invention to mitigate, in such a semiconductor integrated circuit, the influence of an externally applied voltage at the time of high impedance, yet assuring a high-speed "H" data output operation.

In a first semiconductor integrated circuit according to the present invention, there is added, to an output transistor (N-channel MOS transistor) of a conventional NMOS-type data output buffer, an auxiliary transistor (N-channel MOS transistor) of which threshold voltage is lower than that of the output transistor above-mentioned. This semiconductor integrated circuit is arranged such that, when a negative voltage is applied to an external terminal (DQ terminal) at the time of high impedance, the auxiliary transistor is turned on before the output transistor is turned on. This lowers the gate voltage of the output transistor down to a negative voltage level, causing the output transistor to be maintained as cut off. More specifically, the first semiconductor integrated circuit according to the present invention comprises: a first N-channel MOS transistor interposed between a power supply and an external terminal; a second N-channel MOS transistor interposed between the external terminal and a grounding; and a third N-channel MOS transistor interposed between the gate electrode of the first N-channel MOS transistor and the external terminal above-mentioned; the gate electrode of the third N-channel MOS transistor being grounded, and the threshold voltage of the third N-channel MOS transistor being set lower than the threshold voltage of the first N-channel MOS transistor. Between the external terminal and the gate electrode of the second N-channel MOS transistor, there may be interposed a fourth N-channel MOS transistor of which gate electrode is grounded and of which threshold voltage is lower than that of the second N-channel MOS transistor. The threshold voltage may be adjusted by adjusting the concentration of impurities in the channel region immediately below the gate electrode or by adjusting the gate length.

According to the first semiconductor integrated circuit of the present invention, a voltage in the "L" level is applied to the gate electrode of each of the first to third N-channel MOS transistors at the time of high impedance. Further, the third N-channel MOS transistor interposed between the gate electrode of the first N-channel MOS transistor and the external terminal, has a threshold voltage lower than that of the first N-channel MOS transistor. At such a state, when a negative voltage is applied to the external terminal, the third N-channel MOS transistor is turned on before the first N-channel MOS transistor is turned on. This lowers the gate voltage of the first N-channel MOS transistor down to a negative voltage level. This causes the first N-channel MOS transistor to be maintained as cut off to restrain the generation of a substrate current, thus restraining the substrate voltage from being increased. The operation of the fourth N-channel MOS transistor for the second N-channel MOS transistor, is similar to the operation of the third N-channel MOS transistor for the first N-channel MOS transistor.

In a second semiconductor integrated circuit according to the present invention, an N-channel MOS transistor is inserted between an external terminal (DQ terminal) and a P-channel MOS transistor of a conventional CMOS-type data output buffer. Provision is made such that the P-channel MOS transistor is maintained as cut off when a negative voltage is applied to the external terminal at the time of high impedance, and that the N-channel MOS transistor is maintained as cut off when a positive voltage exceeding the power supply voltage, is applied to the external terminal at the time of high impedance. More specifically, the second semiconductor integrated circuit according to the present invention comprises: a P-channel MOS transistor interposed between a power supply and an internal node; a first N-channel MOS transistor interposed between the internal node and the external terminal; a second N-channel MOS transistor interposed between the external terminal and a grounding; and a voltage boosting circuit for supplying, to the gate electrode of the first N-channel MOS transistor, a boosted signal of which voltage is higher than the voltage of the power supply. To achieve a high-speed "H" data output operation, the operation of the voltage boosting circuit is started such that the first N-channel MOS transistor is turned on before either the P-channel MOS transistor or the second N-channel MOS transistor is turned on. Further, there may be disposed means for starting the operation of the voltage boosting circuit in synchronism with an externally applied signal. To further increase the speed of the "H" data output operation, there is further disposed a power supply circuit for supplying, to the voltage boosting circuit, a boosted voltage higher than the power supply voltage. In a semiconductor integrated circuit having a plurality of tristate output circuits, one voltage boosting circuit is commonly used for the plurality of tristate output circuits in order to reduce the layout area.

According to the second semiconductor integrated circuit of the present invention, a voltage in the "H" level or power supply voltage VDD is applied to the gate electrode of the P-channel MOS transistor at the time of high impedance, and a voltage in the "L" level is applied to the gate electrode of each of the first and second N-channel MOS transistors. At such a state, when a negative voltage is applied to the external terminal, the P-channel MOS transistor is maintained as cut off even though the first N-channel MOS transistor is turned on. This restrains the generation of a substrate current, thus restraining the substrate voltage from being increased. Further, even though a positive voltage exceeding the power supply voltage is applied to the external terminal at the time of high impedance, the first N-channel MOS transistor is maintained as cut off. This restrains an increase in drain voltage of the P-channel MOS transistor, thus preventing problems such as latch-up and the like. Further, at the time of the "H" data output operation, a boosted signal of which voltage is higher than the power supply voltage VDD, is supplied to the gate electrode of the added first N-channel MOS transistor. This prevents a voltage drop by Vt in the first N-channel MOS transistor. Thus, there can be obtained an output voltage equivalent to that obtained by a conventional CMOS-type data output buffer. When provision is made such that the operation of the voltage boosting circuit is started such that the first N-channel MOS transistor is turned on before either the P-channel MOS transistor or the second N-channel MOS transistor is turned on, there can be realized a high-speed "H" data output operation equivalent to that realized by a conventional CMOS-type output buffer.

DETAILED DESCRIPTION OF THE INVENTION

With reference to the attached drawings, the following description will discuss in detail DRAMs as semiconductor integrated circuits according to embodiments of the present invention. It is noted that the present invention may also be applied to another semiconductor integrated circuit having a tristate output circuit.

(First Embodiment)

Figure 1:
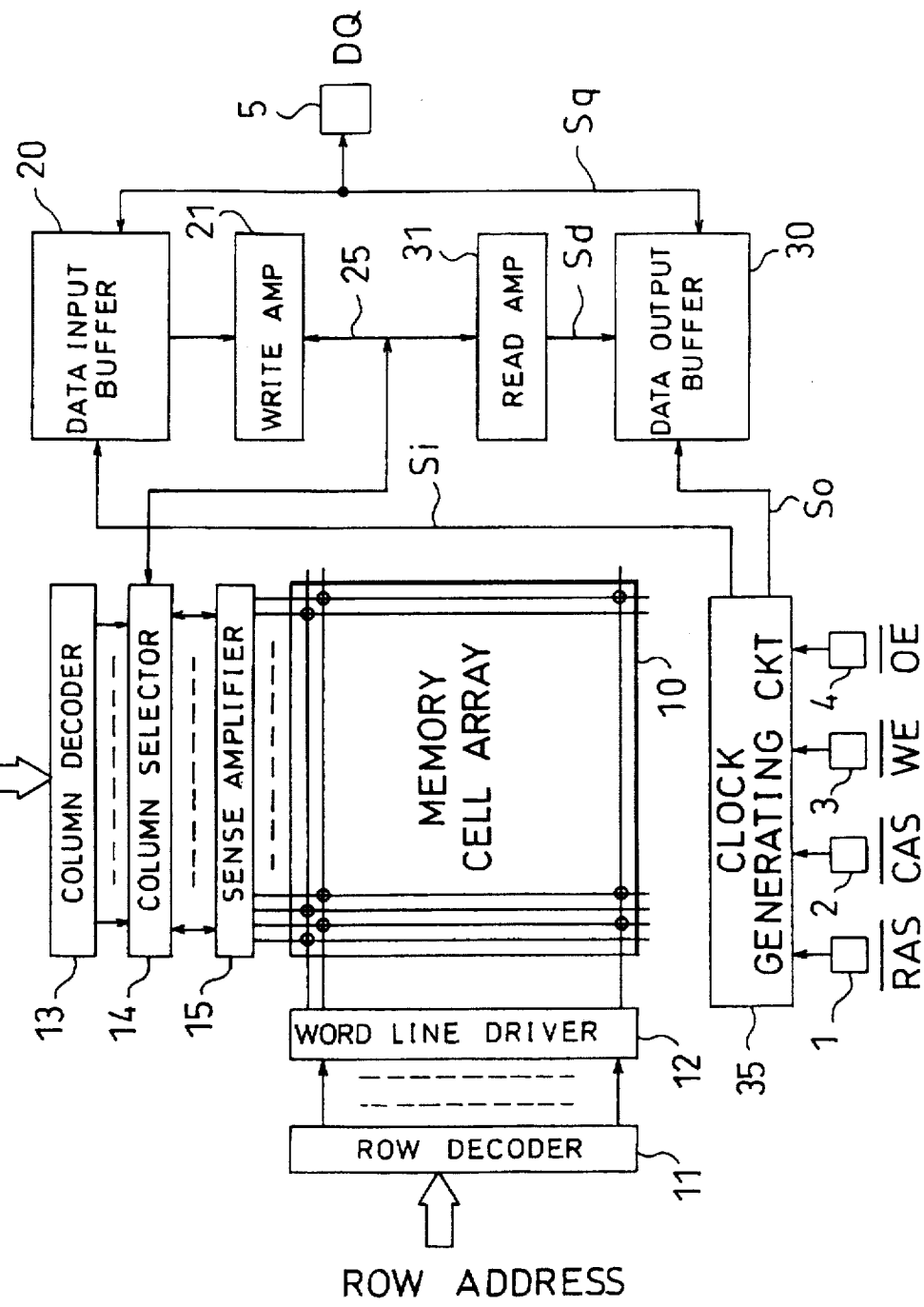
FIG. 1 is a block diagram illustrating the schematic arrangement of a DRAM according to a first embodiment of the present invention.

FIG. 1 is a block diagram illustrating the schematic arrangement of a 1-bit/word DRAM according to a first embodiment of the present invention. Shown in FIG. 1 are a memory cell array 10, a row decoder 11, a word line driver 12, a column decoder 13, a column selector 14, a sense amplifier 15, a data input buffer 20, a write amplifier 21, a data line 25, a data output buffer 30, a read amplifier 31 and a clock generating circuit 35. FIG. 1 also shows one external terminal 5 which is a data input/output terminal or DQ terminal, and four external terminals 1 to 4 for respectively receiving a row address strobe (RAS) signal, a column address strobe (CAS) signal, a write enable (WE) signal and an output enable (OE) signal. These four signals are of negative logic. In FIG. 1, there is omitted the illustration of address input terminals and power supply terminals.

The clock generating circuit 35 is arranged to receive the RAS signal, the CAS signal, the WE signal and the OE signal, and to supply an input activating signal Si to the data input buffer 20 at the time of a write operation of the DRAM, and to supply an output activating signal So to the data output buffer 30 at the time of a read operation of the DRAM. The data input buffer 20 is arranged to supply, to the write amplifier 21, an input data signal having a logic level corresponding to the logic level of a data signal externally supplied to the DQ terminal 5. The output signal of the write amplifier 21 is written in the memory cell array 10 through the data line 25, the column selector 14 and the sense amplifier 15. On the contrary, the signal read by the sense amplifier 15 from the memory cell array 10 is supplied to the read amplifier 31 through the column selector 14 and the data line 25. The read amplifier 31 supplies, to the data output buffer 30, an output data signal Sd having a logic level corresponding to the logic level of the signal supplied thereto. The data output buffer 30 supplies, to the DQ terminal 5, a data signal Sq having a logic level corresponding to the logic level of the output data signal Sd thus supplied.

Figure 2:
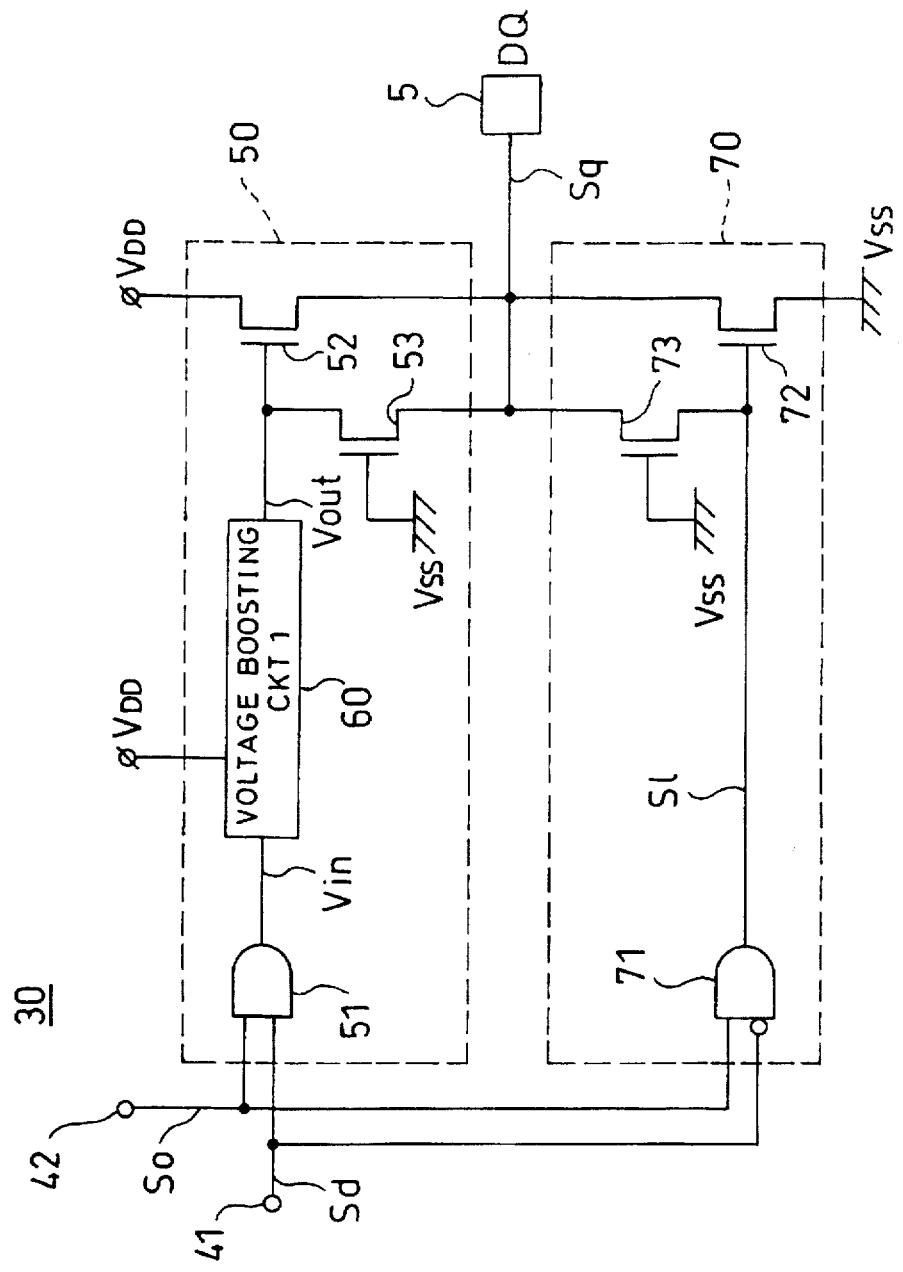
FIG. 2 is a circuit diagram illustrating the inside arrangement of the data output buffer in FIG. 1.

FIG. 2 is a circuit diagram illustrating the inside arrangement of the data output buffer 30 in FIG. 1. In the data output buffer 30, the output data signal Sd is supplied to a first input terminal 41 and the output activating signal So is supplied to a second input terminal 42. In FIG. 2, the data output buffer 30 is arranged to supply, to the DQ terminal 5, the data signal Sq having a logic level corresponding to the logic level of the output data signal Sd when the output activating signal So is in the "H" level. In FIG. 2, a high voltage level output circuit 50 is arranged to supply the data signal Sq in the "H" level to the DQ terminal 5 at the time of an "H" data output operation or when the output data signal Sd is in the "H" level. Also in FIG. 2, a low voltage level output circuit 70 is arranged to supply the data signal Sq in the "L" level to the DQ terminal 5 at the time of an "L" data output operation or when the output data signal Sd is in the "L" level.

The high voltage level output circuit 50 comprises an AND circuit 51, a voltage boosting circuit 60, an output transistor 52 and an auxiliary transistor 53. Each of the output transistor 52 and the auxiliary transistor 53 is an N-channel MOS transistor. An input signal Vin of the voltage boosting circuit 60 is an AND signal of the output data signal Sd and the output activating signal So. The voltage boosting circuit 60 is arranged to supply a signal Vout in the "H" level higher than that of the input signal Vin when the input signal Vin is in the "H" level, and to supply a signal Vout in the "L" level when the input signal Vin is in the "L" level. Provision is made such that the output signal Vout of the voltage boosting circuit 60 is supplied to the gate electrode of the output transistor 52 interposed between a power supply VDD (e.g., 5 V) and the DQ terminal 5. The auxiliary transistor 53 is interposed between the gate electrode of the output transistor 52 and the DQ terminal 5. The gate electrode of the auxiliary transistor 53 is connected to a grounding VSS (0 V).

The low voltage level output circuit 70 comprises an AND circuit 71, an output transistor 72 and an auxiliary transistor 73. Each of the output transistor 72 and the auxiliary transistor 73 is an N-channel MOS transistor. The AND circuit 71 is arranged to supply an AND signal S1 of the inversion signal of the output data signal Sd and the output activating signal So. Provision is made such that the AND signal S1 is supplied to the gate electrode of the output transistor 72 interposed between the DQ terminal 5 and the grounding VSS. The auxiliary transistor 73 is interposed between the DQ terminal 5 and the gate electrode of the output transistor 72. The gate electrode of the auxiliary transistor 73 is connected to the grounding VSS.

The threshold voltage Vtn1 of each of the output transistors 52, 72 and the threshold voltage Vtn2 of each of the auxiliary transistors 53, 73 are so set as to satisfy the relationship of Vtn1>Vtn2. More specifically, the amount of impurity ions to be injected is adjusted or the species of impurity ions is selected such that the concentration of impurities in channel regions immediately below the gate electrodes of the auxiliary transistors 53, 73, is different from the concentration of impurities in channel regions immediately below the gate electrodes of the output transistors 52, 72, thus establishing the relationship of Vtn1>Vtn2. Alternately, the gate length of each of the auxiliary transistors 53, 73 is made shorter than the gate length of each of the output transistors 52, 72, thus establishing the relationship of Vtn1>Vtn2.

Figure 3:
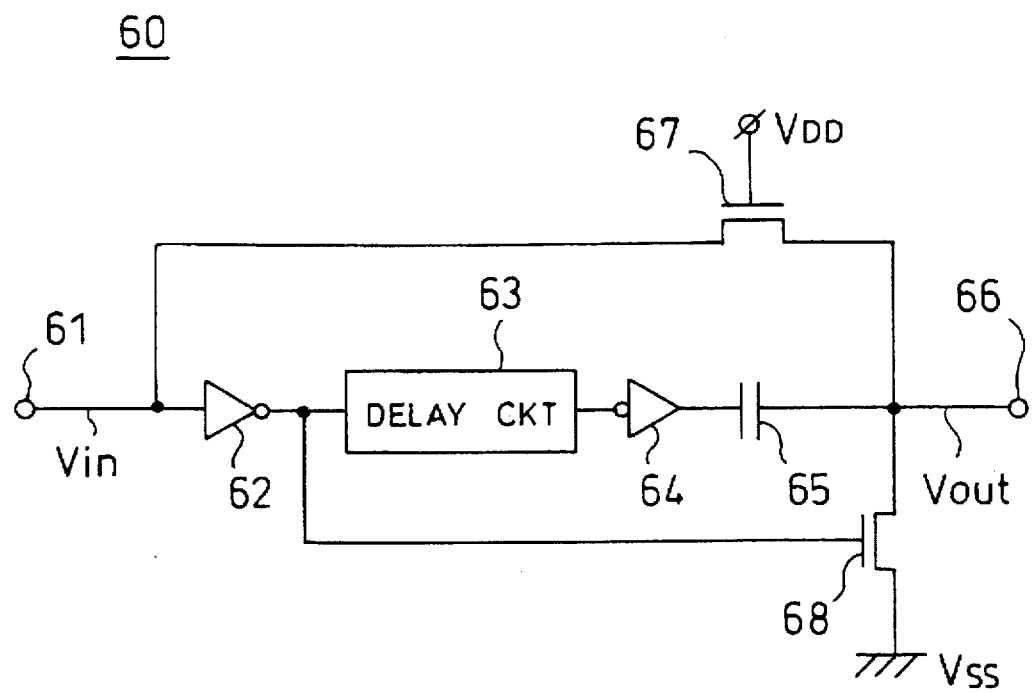
FIG. 3 is a circuit diagram illustrating the inside arrangement of the voltage boosting circuit in FIG. 2.

FIG. 3 is a circuit diagram illustrating the inside arrangement of the voltage boosting circuit 60 in FIG. 2. The input signal Vin is supplied to an input terminal 61 of the voltage boosting circuit 60. The input terminal 61 is connected to one electrode of a capacitor 65 through an inverter 62, a delay circuit 63 and an inverter 64. The other electrode of the capacitor 65 is connected to an output terminal 66 for supplying the output signal Vout. An N-channel MOS transistor 67 is interposed between the input terminal 61 and the output terminal 66, and the gate electrode of the transistor 67 is connected to the power supply VDD. Further, an N-channel MOS transistor 68 is interposed between the output terminal 66 and the grounding VSS. Provision is made such that the output of the inverter 62 is supplied to the gate electrode of the transistor 68.

In the voltage boosting circuit 60 in FIG. 3, the transistor 68 causes the output signal Vout to be brought to the "L" level when the input signal Vin is in the "L" level. On the other hand, when the input signal Vin is changed in level from the "L" level to the "H" level, the transistor 67 causes the output signal Vout to be increased in voltage level to VDD minus Vtn1, wherein the Vtn1 is the threshold voltage of the transistor 67. At this point of time, since the output of the inverter 64 is in the "L" level, the capacitor 65 is charged to VDD minus Vtn1. After the passage of a delay time determined by the delay circuit 63, the inverter 64 raises the potential of one electrode of the capacitor 65. Accordingly, the voltage level of the output signal Vout is brought to VDD plus α (α>0). More specifically, when the input signal Vin is brought to the "H" level (VDD), the output signal Vout is turned into a signal in the "H" level (VDD+α) higher than the level of the input signal Vin.

The following description will successively discuss the operations of the data output buffer 30 in FIG. 2 at the time of a read operation and a non-read operation such as a write operation of the DRAM in FIG. 1.

For an "H" data output operation out of the read operation of the DRAM, the AND signal of the output data signal Sd and the output activating signal So, i.e., the input signal Vin of the voltage boosting circuit 60, is brought to the "H" level and the signal Vout having a voltage level of VDD plus α is supplied to the gate electrode of the output transistor 52. This causes the output transistor 52 to be rapidly and perfectly turned on. On the other hand, the AND signal S1 of the inversion signal of the output data signal Sd and the output activating signal So is brought to the "L" level, and this signal S1 is supplied to the gate electrode of the other output transistor 72. This causes the output transistor 72 to be cut off. Accordingly, the data signal Sq supplied from the DQ terminal 5 is rapidly changed in level to the "H" level which is the voltage level VDD. If the high voltage level output circuit 50 does not have the voltage boosting circuit 60, i.e., if the voltage level of the signal supplied to the gate electrode of the output transistor 52 is equal to VDD, the "H" level of the data signal Sq would be equal to the voltage level of VDD minus Vtn1 wherein the threshold voltage of the output transistor 52 is referred to as Vtn1. In the data output buffer 30 in FIG. 2, the voltage level of the signal Vout supplied to the gate electrode of the output transistor 52 is boosted up to VDD plus α by the voltage boosting circuit 80. This prevents a voltage drop by Vtn1 in the output transistor 52 such that the "H" voltage level of the data signal Sq is boosted up to VDD. Meanwhile, the auxiliary transistors 53, 73 of which gate electrodes are connected to the grounding VSS, are maintained as cut off.

For an "L" data output operation out of the read operation of the DRAM, the AND signal of the output data signal Sd and the output activating signal So, i.e., the input signal Vin of the voltage boosting circuit 60, is brought to the "L" level and the signal Vout in the "L" level is supplied to the gate electrode of the output transistor 52. This causes the output transistor 52 to be cut off. On the other hand, the AND signal S1 of the inversion signal of the output data signal Sd and the output activating signal So is brought to the "H" level, and this signal S1 is supplied to the gate electrode of the other output transistor 72. This causes the output transistor 72 to be turned on. Accordingly, the data signal Sq supplied from the DQ terminal 5 is brought to the "L" level. Meanwhile, the auxiliary transistors 53, 73 of which gate electrodes are connected to the grounding VSS, are maintained as cut off.

For a non-read operation such as a write operation of the DRAM, the data output buffer 30 is not activated and the output activating signal So is maintained at the "L" level. Accordingly, the signal Vout in the "L" level is supplied to the gate electrode of the output transistor 52, which is then cut off. The signal S1 in the "L" level is supplied to the gate electrode of the other output transistor 72, which is then cut off. Accordingly, the data output buffer 30 in FIG. 2 is brought to a high impedance state with respect to the DQ terminal 5. At such a state, when a negative voltage (-VDQ) is externally applied to the DQ terminal 5 and the absolute value VDQ of the voltage thus applied exceeds the threshold voltage Vtn2 (Vtn2>0) of each of the auxiliary transistors 53, 73, the auxiliary transistors 53, 73 are turned on with the output transistors 52, 72 maintained as cut off.

More specifically, when the gate, source and drain voltages of the output transistor 52 are now respectively referred to as Vg1, Vs1, Vd1, the Vg1 is equal to 0 V, the Vs1 is equal to -VDQ (Vtn1<VDQ<-Vtn2), and the Vd1 is equal to 5 V. Accordingly, when the gate-source voltage of the output transistor 52 is now referred to as Vgs1, the Vgs1 (Vgs1=Vg1-Vs1) is smaller than the threshold voltage Vtn1. Therefore, the output transistor 52 is maintained as cut off. On the other hand, when the gate, source and drain voltages of the auxiliary transistor 53 are now respectively referred to as Vg3, Vs3, Vd3, the Vg3 is equal to 0 V, the Vs3 is equal to -VDQ (-VDQ<Vtn2) and the Vd3 is equal to 0 V. Accordingly, when the gate-source voltage of the auxiliary transistor 53 is referred to as Vgs3, the Vgs3 (Vgs3=Vg3-Vs3) is greater than the threshold voltage Vtn2. Accordingly, the auxiliary transistor 53 is turned on and lowers the gate voltage of the output transistor 52 down to a negative voltage of -(VDQ-Vtn2). After the auxiliary transistor 53 has been turned on in this manner, the Vgs1 is equal to Vtn2 (Vtn2<Vtn1). Thus, the output transistor S2 is never turned on.

On the other hand, when the gate, source and drain voltages of the output transistor 72 are now respectively referred to as Vg2, Vs2, Vd2, the Vg2 is equal to 0 V, the Vs2 is equal to -VDQ (-Vtn1<-VDQ <-Vtn2), and the Vd2 is equal to 0 V. Accordingly, when the gate-source voltage of the output transistor 72 is now referred to as Vgs2, the Vgs2 (Vgs2=Vg2-Vs2) is smaller than the threshold voltage Vtn1. Therefore, the output transistor 72 is maintained as cut off. On the other hand, when the gate, source and drain voltages of the auxiliary transistor 73 are now respectively referred to as Vg4, Vs4, Vd4, the Vg4 is equal to 0 V, the Vs4 is equal to -VDQ (-VDQ<-Vtn2), and the Vd4 is equal to 0 V. Accordingly, when the gate-source voltage of the auxiliary transistor 73 is now referred to as Vgs4, the Vgs4 (Vgs4=Vg4-Vs4) is greater than the threshold voltage Vtn2.

Accordingly, the auxiliary transistor 73 is turned on and lowers the gate voltage of the output transistor 72 down to a negative voltage of −(VDQ−Vtn2). After the auxiliary transistor 73 has been turned on in this manner, the Vgs2 is equal to Vtn2 (Vtn2<Vtn1). Thus, the output transistor 72 is never turned on.

As thus discussed, according to the first embodiment, there are disposed the auxiliary transistors 53, 73 each having the threshold voltage Vtn2 which satisfies the relationship of Vtn2<Vtn1 wherein the Vtn1 is the threshold voltage of each of the output transistors 52, 72, such that the upper limit value of each of the gate-source voltages Vgs1, Vgs2 of the output transistors 52, 72 is limited to the Vtn2. Accordingly, even though a negative voltage is externally applied to the DQ terminal 5 at the time of the non-read operation of the DRAM, the output transistors 52, 72 are maintained as cut off. This prevents the generation of a substrate current resulting from the output transistors 52, 72, enabling the substrate voltage to be maintained at a negative voltage.

To maintain the threshold voltage Vtn1 of each of the output transistors 52, 72 and the threshold voltage Vtn2 of each of the auxiliary transistors 53, 73 such that the Vtn1 is greater than the Vtn2, the Vtn1 may be set to a usual value identical with the threshold voltage of other N-channel MOS transistors of the DRAM with the Vtn2 set lower than the usual value above-mentioned. Alternately, the Vtn2 may be set to a usual value with the Vtn1 set higher than the usual value above-mentioned.

(Second Embodiment)

Figure 4:
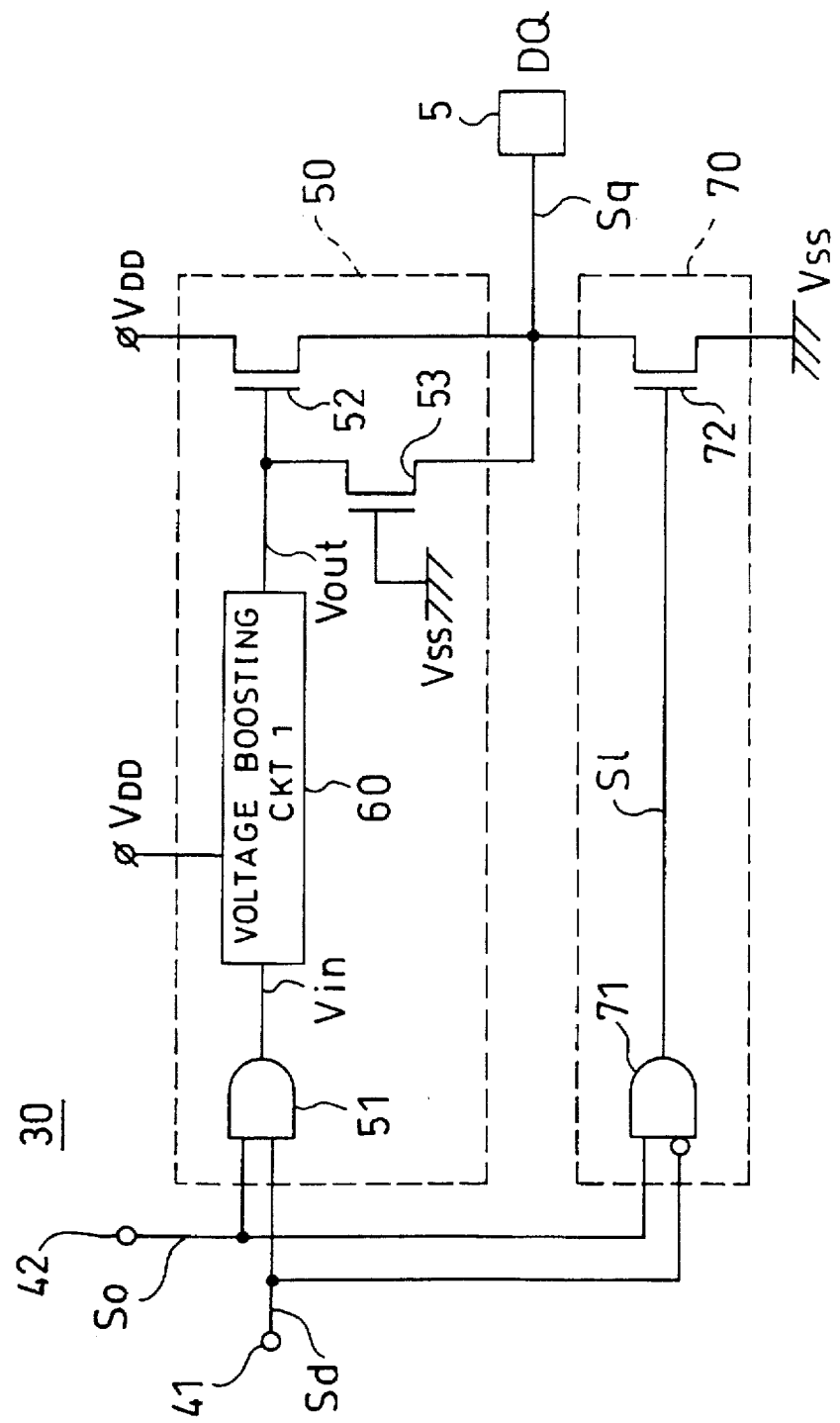
FIG. 4 is a circuit diagram illustrating the inside arrangement of the data output buffer used in a DRAM according to a second embodiment of the present invention.

FIG. 4 is a circuit diagram illustrating the inside arrangement of a data output buffer 30 employed in a 1-bit/word DRAM according to a second embodiment of the present invention. The arrangement in FIG. 4 is different from the arrangement in FIG. 2 only in that the auxiliary transistor 73 in the low voltage level output circuit 70 in FIG. 2 is omitted in the arrangement in FIG. 4.

According to the second embodiment, when a negative voltage (−VDQ) is externally applied to a DQ terminal 5 at the time of a non-read operation of the DRAM and the absolute value VDQ of the voltage thus applied exceeds the threshold voltage Vtn1 (Vtn1>0) of an output transistor 72, the output transistor 72 is turned on. However, when the drain-source and gate-source voltages of the output transistor 72 are now respectively referred to as Vds2, Vgs2, the Vds2 is equal to Vgs2. Accordingly, the drain current Ids2 of the output transistor 72 is small and the generated substrate current is very small. Thus, the second embodiment also produces effects similar to those produced by the first embodiment.

(Third Embodiment)

Figure 5:
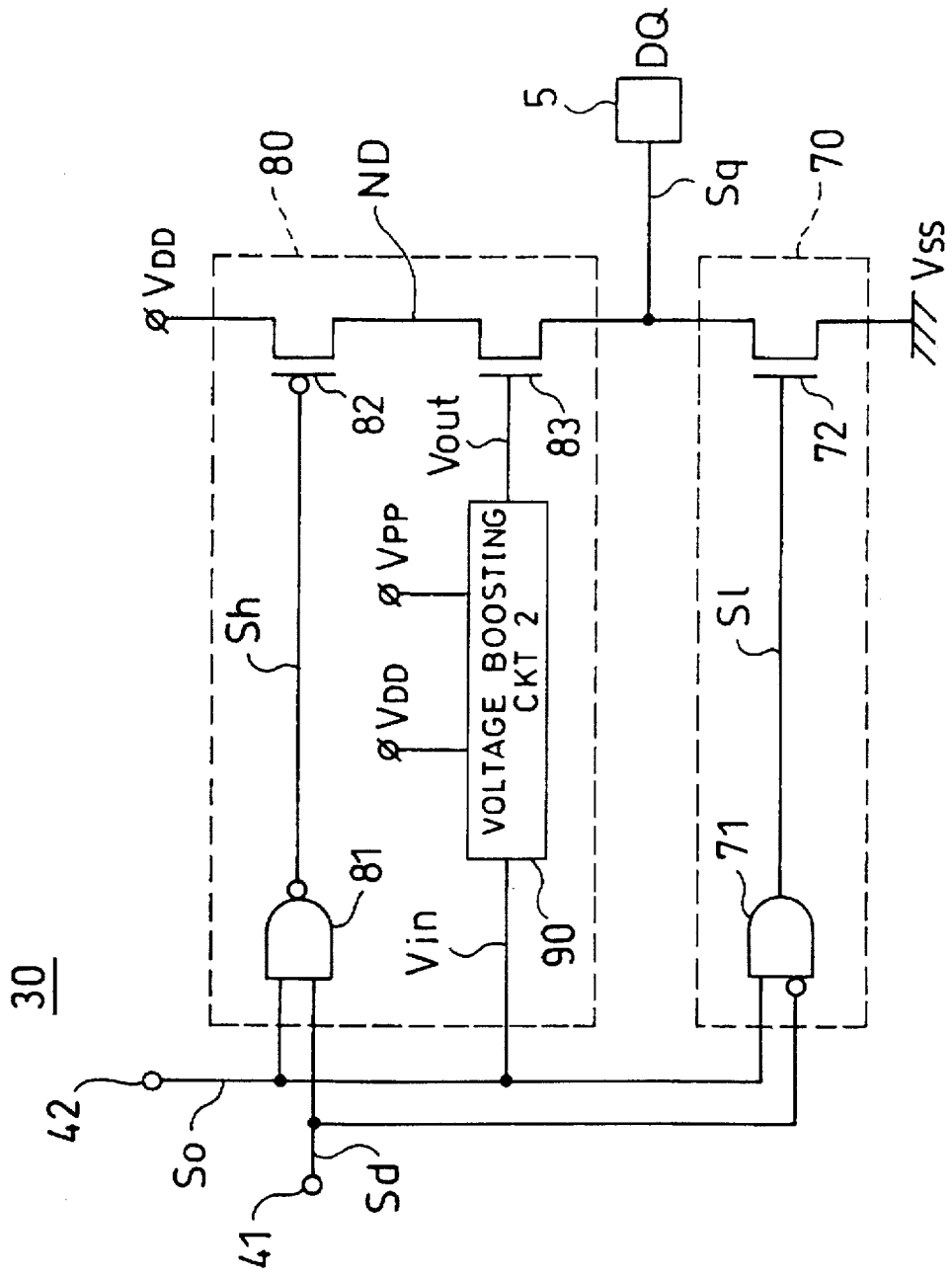
FIG. 5 is a circuit diagram illustrating the inside arrangement of theta output buffer used in a DRAM according to a third embodiment of the present invention.

FIG. 5 is a circuit diagram illustrating the inside arrangement of a data output buffer 30 employed in a 1-bit/word DRAM according to a third embodiment of the present invention. The arrangement in FIG. 5 is different from the arrangement in FIG. 4 only in the arrangement of the high voltage level output circuit.

In FIG. 5, a high voltage level output circuit 80 comprises a NAND circuit 81, a voltage boosting circuit 90, a PMOS output transistor (P-channel MOS transistor) 82, and an NMOS output transistor (N-channel MOS transistor) 83. The PMOS output transistor 82 is interposed between a power supply VDD and an internal node ND, and the NMOS output transistor 83 is interposed between the internal node ND and a DQ terminal 5. More specifically, the PMOS output transistor 82 and the NMOS output transistor 83 are connected in series between the power supply VDD and the DQ terminal 5. A NAND signal Sh of an output data signal Sd and an output activating signal So, is supplied to the gate electrode of the PMOS output transistor 82. An input signal Vin of the voltage boosting circuit 90 is the output activating signal So. The voltage boosting circuit 90 is arranged to always receive a boosted power supply voltage VPP (VPP>VDD), in addition to the power supply voltage VDD. Thus, the voltage boosting circuit 90 is arranged to supply a signal Vout in the "H" level higher than the level of the input signal Vin when the input signal Vin is in the "H" level, and to supply a signal Vout in the "L" level when the input signal Vin is in the "L" level. Provision is made such that the output signal Vout of the voltage boosting circuit 90 is supplied to the gate electrode of the NMOS output transistor 83.

Figure 6:
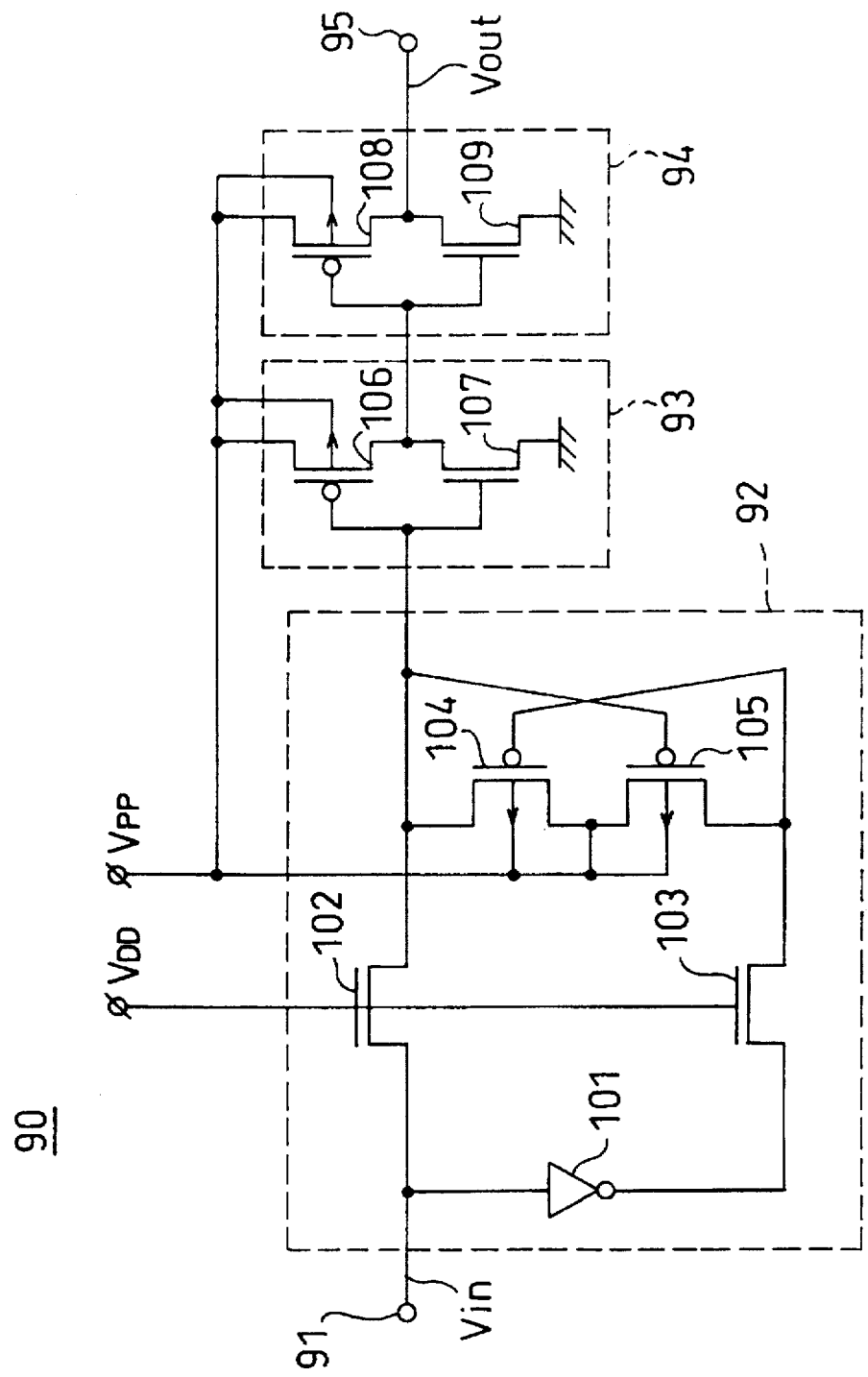
FIG. 6 is a circuit diagram illustrating the inside arrangement of the voltage boosting circuit in FIG. 5.

FIG. 6 is a circuit diagram illustrating the inside arrangement of the voltage boosting circuit 90 in FIG. 5. The input signal Vin is supplied to an input terminal 91 of the voltage boosting circuit 90. Through a converter 92, a first inverter 93 and a second inverter 94, the input terminals 91 is connected to an output terminal 95 for supplying the output signal Vout. The converter 92 comprises an inverter 101, two N-channel MOS transistors 102, 103, and two P-channel MOS transistors 104, 105. The first inverter 93 is a CMOS inverter comprising a P-channel MOS transistor 106 and an N-channel MOS transistor 107. The second inverter 94 is also a CMOS inverter comprising a P-channel MOS transistor 108 and an N-channel MOS transistor 109. According to the voltage boosting circuit 90 in FIG. 6, when the input signal Vin is brought to the "H" level (VDD), the output signal Vout becomes a signal in the "H" level (VDD+α) higher than the level of the input signal Vin with the use of the boosted power supply voltage VPP. Further, since the arrangement in FIG. 6 does not have a delay circuit unlike the arrangement in FIG. 3, the output signal Vout is changed in level from the "L" level to the "H" level at high speed in response to the change in level of the input signal Vin from the "L" level to the "H" level.

Figure 7:
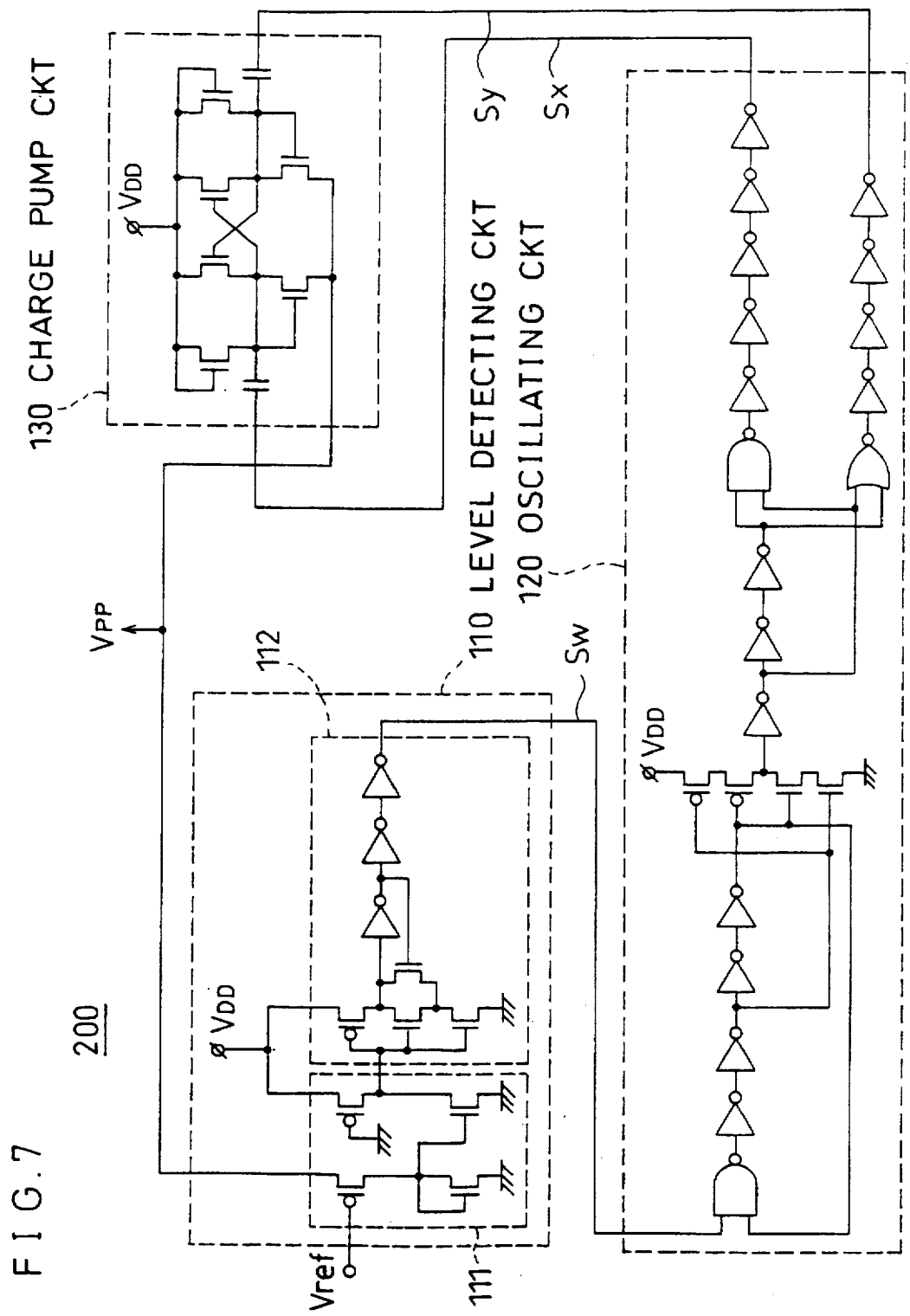
FIG. 7 is a circuit diagram illustrating the arrangement of a power supply boosting circuit for supplying a boosted power supply voltage to the voltage boosting circuit in FIG. 6.

FIG. 7 is a circuit diagram illustrating the arrangement of a power supply boosting circuit 200 for supplying a boosted power supply voltage VPP to the voltage boosting circuit 90. Shown in FIG. 7 are a level detecting circuit 110 for detecting the level of the boosted power supply voltage VPP, an oscillating circuit 120 and a charge pump circuit 180 for generating the boosted power supply voltage VPP. The level detecting circuit 110 comprises a comparing circuit 111 for comparing the boosted power supply voltage VPP with a reference voltage Vref, and a hysteresis circuit 112. The level detecting circuit 110 is arranged to supply a level detection signal Sw to the oscillating circuit 120. The oscillating circuit 120 is arranged to supply complementary signals Sx and Sy to the charge pump circuit 180.

In the comparing circuit 111, the absolute value of the threshold voltage of a P-channel MOS transistor having a gate electrode to which the reference voltage Vref is supplied, is now referred to as Vtp. According to the power supply boosting circuit 200 in FIG. 7, when the VPP is smaller than Vref plus Vtp, the level detecting signal Sw is brought to the "H" level. Upon reception of the level detecting signal Sw, the oscillating circuit 120 is operated to supply the complementary signals Sx, Sy to the charge pump circuit 130. As a result, the voltage VPP is increased. When the VPP becomes greater than Vref plus Vtp, the level detecting signal Sw is brought to the "L" level to stop the operation of the oscillating circuit 120, thus stopping the operation of the charge pump circuit 130. Therefore, there can always be obtained the boosted power supply voltage VPP substantially having a voltage level of Vref plus Vtp higher than the voltage level of VDD. Further, there is employed the arrangement in which the reference voltage Vref is supplied to the gate electrode of the P-channel MOS transistor in the comparing circuit 111. Accordingly, there can be generated the boosted power supply voltage VPP without the reference voltage Vref made unstable.

Figure 8:
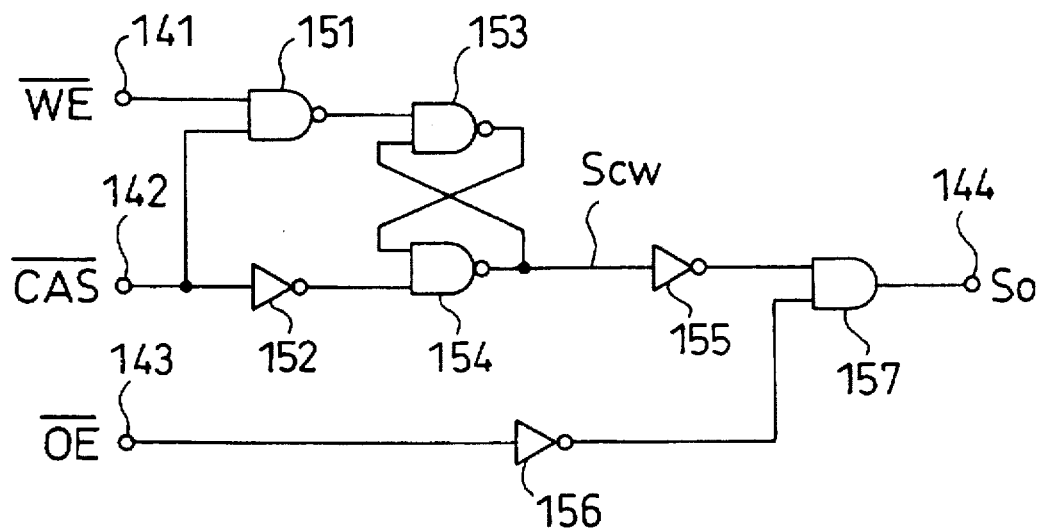
FIG. 8 is a circuit diagram illustrating the arrangement of a control circuit for supplying an output activating signal to the data output buffer in FIG. 5.

FIG. 8 is a circuit diagram illustrating the arrangement of a control circuit for supplying the output activating signal So to the data output buffer 30 in FIG. 5. The control circuit in FIG. 8 is to be incorporated in the clock generating circuit 35 in FIG. 1. This control circuit has a first input terminal 141 for receiving a WE signal, a second input terminal 142 for receiving a CAS signal, a third input terminal 143 for receiving an OE signal, and an output terminal 144 from which the output activating signal So is supplied. This control circuit has three NAND circuits 151, 153, 154, three inverters 152, 155, 156 and one AND circuit 157. Of these, two NAND circuits 153, 154 form a flip-flop which is arranged to supply a flip-flop signal Scw.

Figure 9:
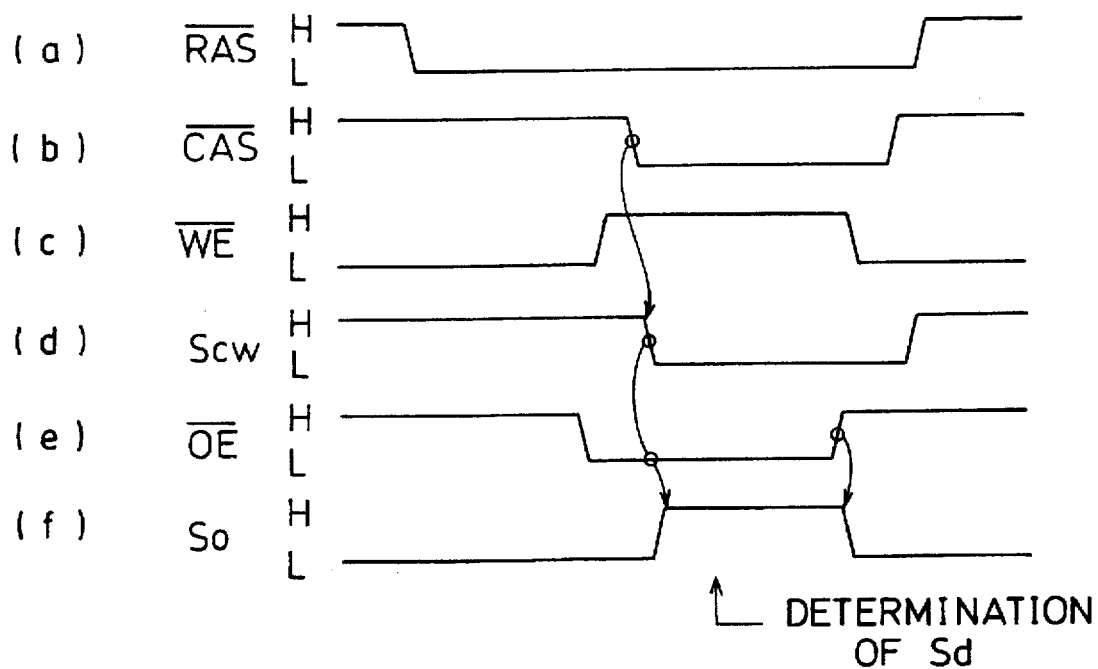
FIG. 9 includes charts indicating the operational timing of the control circuit in FIG. 8.

With reference to FIGS. 9(a) to 9(f) of operational timing charts, the following description will discuss the operation of the data output buffer 30 in FIG. 5 at the time of a read operation of the DRAM. As shown in FIGS. 9(a) to 9(c), at the time of a read operation of the DRAM, the CAS signal falls after the RAS signal has fallen and after the WE signal has risen. When the CAS signal has fallen, the flip-flop signal Scw in FIG. 8 falls. As shown in FIGS. 9(d) to 9(f), when the OE signal had already been activated to the "L" level at the time the signal Scw fell, the output activating signal So is changed in level from the "L" level to the "H" level before the output data signal Sd is determined. On the other hand, when the OE signal falls after the signal Scw has fallen, the output activating signal So is changed in level to the "H" level in synchronism with the falling of the OE signal. More specifically, according to the control circuit in FIG. 8, before the output data signal Sd is determined, the output activating signal So is changed in level to the "H" level in synchronism with the falling of the CAS signal or the falling of the OE signal whichever is the later. Thereafter, the output activating signal So is returned to the "L" level in synchronism with the rising of the CAS signal or the rising of the OE signal whichever is the earlier.

When the output activating signal So is changed in level to the "H" level, the voltage boosting circuit 90 in FIG. 5 immediately operates and the boosted signal Vout is supplied to the gate electrode of the NMOS output transistor 83 before the output data signal Sd is determined. As a result, the NMOS output transistor 83 is rapidly and perfectly turned on. Since the voltage boosting circuit 90 starts operating before the output data signal Sd is determined, the NMOS output transistor 83 is turned on before the PMOS output transistor 82 and the output transistor 72 are turned on. Thereafter, at the time of an "H" data output operation where the level of the output data signal Sd is determined to the "H" level, both signals Sh and S1 are brought to the "L" level and the PMOS output transistor 82 is turned on while the output transistor 72 is cut off. As a result, a data signal Sq in the "H" level is supplied from the DQ terminal 5 by the PMOS output transistor 82 and the NMOS output transistor 83 of the high voltage level output circuit 80. On the other hand, at the time of an "L" data output operation where the level of the output data signal Sd is determined to the "L" level, both signals Sh and S1 are brought to the "H" level and the PMOS output transistor 82 is cut off while the output transistor 72 is turned on. As a result, the data signal Sq in the "L" level is supplied from the DQ terminal 5 by the output transistor 72 of the low voltage level output circuit 70.

The following description will discuss the operation of the data output buffer 30 in FIG. 5 at the time of a non-read operation such as a write operation of the DRAM. At the write operation of the DRAM, the WE signal is in the "L" level at the point of time the CAS signal falls. Even though the WE signal rises thereafter, the flip-flop signal Scw in FIG. 8 is maintained at the "H" level. This causes the output activating signal So to be maintained at the "L" level. Also the fact that the OE signal is maintained at the "H" level, assures the retention of the "L" level of the output activating signal So. Accordingly, the signal Sh is maintained at the "H" level, the signals Vout and S1 are maintained at the "L" level, and all the PMOS output transistor 82, the NMOS output transistor 83 and the output transistor 72 are cut off. As a result, the data output buffer 30 in FIG. 5 is brought to a high impedance state with respect to the DQ terminal 5. At such a state, when a negative voltage (−VDQ) is externally applied to the DQ terminal 5 and the absolute value VDQ of the voltage thus applied exceeds the threshold voltage Vtn (Vtn>0) of the NMOS output transistor 83, the NMOS output transistor 83 is turned on. However, since the PMOS output transistor 82 is maintained as cut off, no drain current is supplied to the NMOS output transistor 83 from the power supply VDD. Therefore, a substrate current resulting from the fact that the NMOS output transistor 83 has been turned on, is not generated, enabling the substrate voltage to be maintained at a negative voltage level. Further, even though a positive voltage VDQ' exceeding the power supply voltage VDD is externally applied to the DQ terminal 5 with the data output buffer 30 in FIG. 5 being in a high impedance state, the NMOS output transistor 83 is maintained as cut off. This restrains the PMOS output transistor 82 from being increased in drain voltage, thus preventing problems such as latch-up, breakage of memory cell data, and the like.

As thus discussed, the third embodiment employs the high voltage level output circuit 80 having the arrangement in which the series circuit of the PMOS output transistor 82 and the NMOS output transistor 83 is interposed between the power supply VDD and the DQ terminal 5. Accordingly, even though a negative voltage is externally applied to the DQ terminal 5 at the time of a non-read operation of the DRAM, the substrate voltage can be maintained at a negative voltage, and even though a positive voltage exceeding the power supply voltage VDD is externally applied to the DQ terminal 5 at the time of a non-read operation, this does not introduce problems such as latch-up and the like.

Further, provision is made such that the boosted signal Vout of which voltage is higher than the power supply voltage VDD, is supplied to the gate electrode of the NMOS output transistor 83. This prevents a voltage drop in the NMOS output transistor 83 at the time of the "H" data output operation. Further, since provision is made such that the voltage boosting circuit 90 starts operating before the output data signal Sd is determined, the "H" data output operation can be executed at a speed equivalent to that of a conventional CMOS-type data output buffer. In particular, provision is made such that the output activating signal So used for starting the voltage boosting circuit 90, is changed in level to the "H" level in synchronism with the CAS or OE signal only at the time of a read operation of the DRAM. This lowers the input capacitance of the DQ terminal 5 at the time of a non-read operation.

According to each of the first and second embodiments, the delay time in the voltage boosting circuit 60 is increased as the power supply voltage VDD is lowered. On the other hand, the third embodiment uses the voltage boosting circuit 90 which incorporates no delay circuit and which uses a boosted power supply voltage VPP to be supplied at all times. Accordingly, even though the power supply voltage VDD becomes low, the voltage boosting circuit 90 undergoes no substantial change in delay time. Therefore, as compared with the first and second embodiments, the third embodiment is considerably improved in "H" data output speed when a low power supply voltage is used. It is noted that, when the NMOS output transistor 83 can be turned on before the output data signal Sd is determined, the voltage boosting circuit 60 in FIG. 3 may also be adopted instead of the voltage boosting circuit 90 in FIG. 9.

(Fourth Embodiment)

Figure 10:
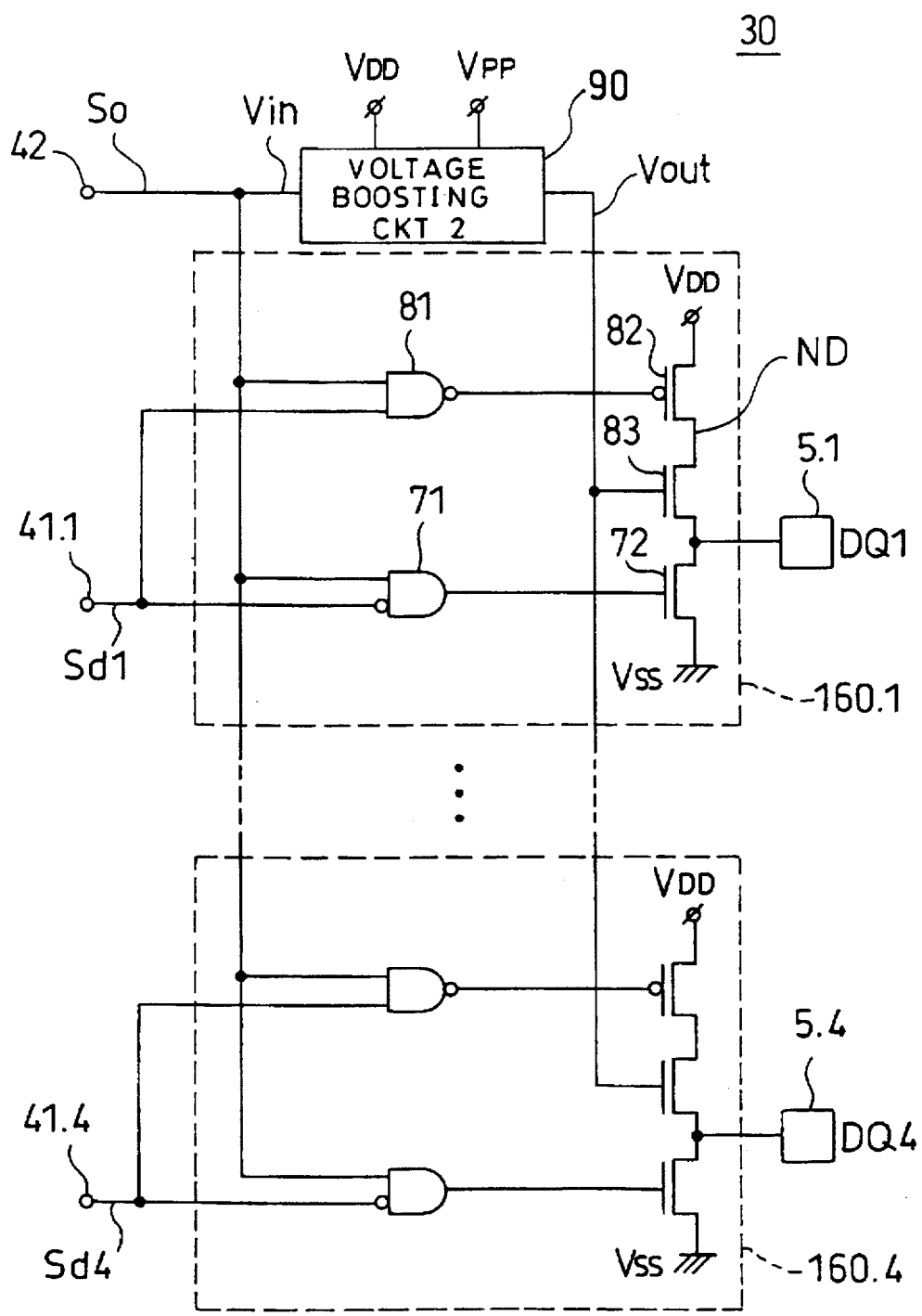
FIG. 10 is a circuit diagram illustrating the inside arrangement of the data output buffer used in a DRAM according to a fourth embodiment of the present invention.

FIG. 10 is a circuit diagram illustrating the inside arrangement of a data output buffer 30 used in a 4-bit/word DRAM according to a fourth embodiment of the present invention. In the fourth embodiment, four DQ terminals (DQ1 to DQ4) 5.1 to 5.4 are disposed as corresponding to the arrangement where one word is formed by four bits.

The data output buffer 30 in FIG. 10 comprises four input terminals 41.1 to 41.4 for respectively receiving output data signals Sd1 to Sd4 of the first to fourth bits, one input terminal 42 for receiving an output activating signal So, four tristate output circuits 160.1 to 160.4 and one voltage boosting circuit 90. The inside arrangement of each of the four tristate output circuits 160.1 to 160.4 is similar to that shown in FIG. 5. However, provision is made such that the common voltage boosting circuit 90 supplies a signal Vout to the gate electrode of an NMOS output transistor 83 in each of the tristate output circuits 160.1 to 160.4. The common voltage boosting circuit 90 has the inside arrangement as shown in FIG. 6.

According to the fourth embodiment, there can be produced, in the 4-bit/word DRAM, effects equivalent to those produced by the third embodiment. Further, the fourth embodiment is reduced in layout area as compared with the arrangement where separate voltage boosting circuits are disposed for the four DQ terminals 5.1 to 5.4. Alternately, one voltage boosting circuit 90 may be disposed for eight DQ terminals.

What is claimed is:

1. A semiconductor integrated circuit comprising:
   a first N-channel MOS transistor interposed between a power supply and an external terminal;
   a second N-channel MOS transistor interposed between said external terminal and a grounding; and
   a third N-channel MOS transistor interposed between a gate electrode of said first N-channel MOS transistor and said external terminal;
   a gate electrode of said third N-channel MOS transistor being grounded, and
   a threshold voltage of said third N-channel MOS transistor being set lower than a threshold voltage of said first N-channel MOS transistor.

2. A semiconductor integrated circuit according to claim 1, wherein a channel region immediately below said gate electrode of said third N-channel MOS transistor, has a concentration of impurities different from that of a channel region immediately below said gate electrode of said first N-channel MOS transistor such that said threshold voltage of said third N-channel MOS transistor is lower than said threshold voltage of said first N-channel MOS transistor.

3. A semiconductor integrated circuit according to claim 1, wherein said third N-channel MOS transistor has a gate length shorter than that of said first N-channel MOS transistor such that said threshold voltage of said third N-channel MOS transistor is lower than said threshold voltage of said first N-channel MOS transistor.

4. A semiconductor integrated circuit according to claim 1, further comprising a fourth N-channel MOS transistor interposed between said external terminal and a gate electrode of said second N-channel MOS transistor,
   a gate electrode of said fourth N-channel MOS transistor being grounded, and
   a threshold voltage of said fourth N-channel MOS transistor being set lower than a threshold voltage of said second N-channel MOS transistor.

5. A semiconductor integrated circuit according to claim 4, wherein a channel region immediately below said gate electrode of said fourth N-channel MOS transistor, has a concentration of impurities different from that of a channel region immediately below said gate electrode of said second N-channel MOS transistor such that said threshold voltage of said fourth N-channel MOS transistor is lower than said threshold voltage of said second N-channel MOS transistor.

6. A semiconductor integrated circuit according to claim 4, wherein said fourth N-channel MOS transistor has a gate length shorter than that of said second N-channel MOS transistor such that said threshold voltage of said fourth N-channel MOS transistor is lower than said threshold voltage of said second N-channel MOS transistor.

7. A semiconductor integrated circuit comprising:
   a P-channel MOS transistor interposed between a power supply and an internal node;
   a first N-channel MOS transistor interposed between said internal node and an external terminal;
   a second N-channel MOS transistor interposed between said external terminal and a grounding; and
   a voltage boosting circuit for supplying, to a gate electrode of said first N-channel MOS transistor, a boosted signal of which voltage is higher than a voltage of said power supply.

8. A semiconductor integrated circuit according to claim 7, further comprising means for starting an operation of said voltage boosting circuit such that said first N-channel MOS transistor is turned on before either said P-channel MOS transistor or said second N-channel MOS transistor is turned on.

9. A semiconductor integrated circuit according to claim 8, further comprising means for starting the operation of said voltage boosting circuit in synchronism with an externally supplied signal.

10. A semiconductor integrated circuit according to claim 7, further comprising a power supply circuit for supplying, to said voltage boosting circuit, a boosted voltage higher than the voltage of said power supply.

11. A semiconductor integrated circuit having a plurality of tristate output circuits, wherein
   each of said tristate output circuits comprises:
   a P-channel MOS transistor interposed between a power supply and an internal node;
   a first N-channel MOS transistor interposed between said internal node and an external terminal; and
   a second N-channel MOS transistor interposed between said external terminal and a grounding,
   said semiconductor integrated circuit further comprising a voltage boosting circuit for supplying a boosted signal of which voltage is higher than a voltage of said power supply, to a gate electrode of said first N-channel MOS transistor of each of said plurality of tristate output circuits.

* * * * *